United States Patent
Cho et al.

(10) Patent No.: US 11,776,941 B2
(45) Date of Patent: Oct. 3, 2023

(54) SEMICONDUCTOR PACKAGE

(71) Applicant: Samsung Electronics Co., Ltd., Suwon-si (KR)

(72) Inventors: Yonghoe Cho, Cheonan-si (KR); Sunkyoung Seo, Cheonan-si (KR); Chajea Jo, Yongin-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 78 days.

(21) Appl. No.: 17/357,378

(22) Filed: Jun. 24, 2021

(65) Prior Publication Data
US 2022/0122955 A1 Apr. 21, 2022

(30) Foreign Application Priority Data
Oct. 19, 2020 (KR) ......................... 10-2020-0135421

(51) Int. Cl.
*H01L 23/498* (2006.01)
*H01L 25/16* (2023.01)
*H01L 23/14* (2006.01)
*H01L 23/00* (2006.01)
*H01L 23/538* (2006.01)

(52) U.S. Cl.
CPC .......... *H01L 25/167* (2013.01); *H01L 23/147* (2013.01); *H01L 23/49811* (2013.01); *H01L 23/49822* (2013.01); *H01L 23/5383* (2013.01); *H01L 24/16* (2013.01); *H01L 2224/16227* (2013.01)

(58) Field of Classification Search
CPC .................................................... H01L 25/167
See application file for complete search history.

(56) References Cited

U.S. PATENT DOCUMENTS

| | | | |
|---|---|---|---|
| 9,276,140 B1* | 3/2016 | Tam | H01L 31/02325 |
| 9,299,738 B1 | 3/2016 | Brown et al. | |
| 9,368,458 B2 | 6/2016 | Wu et al. | |
| 9,883,168 B2 | 1/2018 | Kim | |
| 9,997,554 B2 | 6/2018 | Grebet et al. | |
| 10,694,114 B2 | 6/2020 | Venkataraman et al. | |
| 2006/0012966 A1* | 1/2006 | Chakravorty | H01L 23/642 |
| | | | 257/E23.079 |
| 2006/0097129 A1* | 5/2006 | Sun | H01L 27/14618 |
| | | | 257/E31.118 |
| 2012/0181646 A1* | 7/2012 | Han | H04N 23/45 |
| | | | 257/E31.127 |
| 2018/0039064 A1* | 2/2018 | Kavusi | H04N 5/2257 |

FOREIGN PATENT DOCUMENTS

JP 2010199602 A 9/2010
WO WO-2018121288 A1 * 7/2018

* cited by examiner

*Primary Examiner* — Selim U Ahmed
*Assistant Examiner* — Evan G Clinton
(74) *Attorney, Agent, or Firm* — Muir Patent Law, PLLC

(57) ABSTRACT

A semiconductor package includes a package substrate, a connection substrate on the package substrate, a first image sensor chip on the connection substrate, a second image sensor chip on the connection substrate, the second image sensor chip being horizontally spaced apart from the first image sensor chip, and a memory chip disposed on the package substrate and electrically connected to the first image sensor chip through the connection substrate. A distance between the first image sensor chip and the second image sensor chip is less than a thickness of the first image sensor chip.

20 Claims, 12 Drawing Sheets

SEMICONDUCTOR PACKAGE

CROSS-REFERENCE TO RELATED APPLICATION

This U.S. non-provisional patent application claims priority under 35 U.S.C. § 119 to Korean Patent Application No. 10-2020-0135421, filed on Oct. 19, 2020, in the Korean Intellectual Property Office, the disclosure of which is hereby incorporated by reference in its entirety.

BACKGROUND

Embodiments of the inventive concepts relate to a semiconductor package and, more particularly, to a semiconductor package including an image sensor chip.

An image sensor may be a semiconductor device for changing an optical image into electrical signals. Image sensors may include charge coupled device (CCD) image sensors and complementary metal-oxide-semiconductor (CMOS) image sensors (CIS). Image sensors have been applied to cameras, camcorders, multimedia personal computers, and/or security cameras and have been increasingly used in recent years.

As the number of image sensors in a single semiconductor package increases, interconnection paths may be increasingly complicated and lengthened and a mounting space of the image sensors may be limited. Thus, semiconductor packages having new structures are being studied to overcome these limitations.

SUMMARY

Embodiments of the inventive concepts may provide a semiconductor package capable of reducing a mounting area of an image sensor chip and of improving electrical efficiency and reliability.

In an aspect, a semiconductor package may include a package substrate, a connection substrate on the package substrate, a first image sensor chip on the connection substrate, a second image sensor chip horizontally on the connection substrate, the second image sensor chip being spaced apart from the first image sensor chip, and a memory chip disposed on the package substrate and electrically connected to the first image sensor chip through the connection substrate. A distance between the first image sensor chip and the second image sensor chip may be less than a thickness of the first image sensor chip.

In an aspect, a semiconductor package may include a package substrate, a connection substrate disposed on the package substrate, the connection substrate comprising a support layer, a through-electrode vertically penetrating the support layer, and a redistribution layer electrically connected to the through-electrode, a first image sensor chip mounted on the redistribution layer, a second image sensor chip mounted on the redistribution layer and horizontally spaced apart from the first image sensor chip, a first semiconductor chip disposed on the package substrate and electrically connected to the first image sensor chip through the connection substrate, and a second semiconductor chip disposed on the package substrate and electrically connected to the first image sensor chip through the connection substrate. A distance between the first image sensor chip and the second image sensor chip may be less than a distance between the first semiconductor chip and the second semiconductor chip.

In an aspect, a semiconductor package may include a package substrate, a connection substrate on the package substrate, a first image sensor chip on the connection substrate, a second image sensor chip horizontally spaced apart from the first image sensor chip on the connection substrate, a memory chip disposed on the package substrate and electrically connected to the first image sensor chip through the connection substrate, and a logic chip disposed on the package substrate and horizontally spaced apart from the memory chip. A distance between the first image sensor chip and the second image sensor chip may be less than a distance between the memory chip and the logic chip.

BRIEF DESCRIPTION OF THE DRAWINGS

The inventive concepts will become more apparent in view of the attached drawings and accompanying detailed description.

DETAILED DESCRIPTION OF THE EMBODIMENTS

Semiconductor packages according to the inventive concepts will be described hereinafter with reference to the accompanying drawings.

Figure 1:
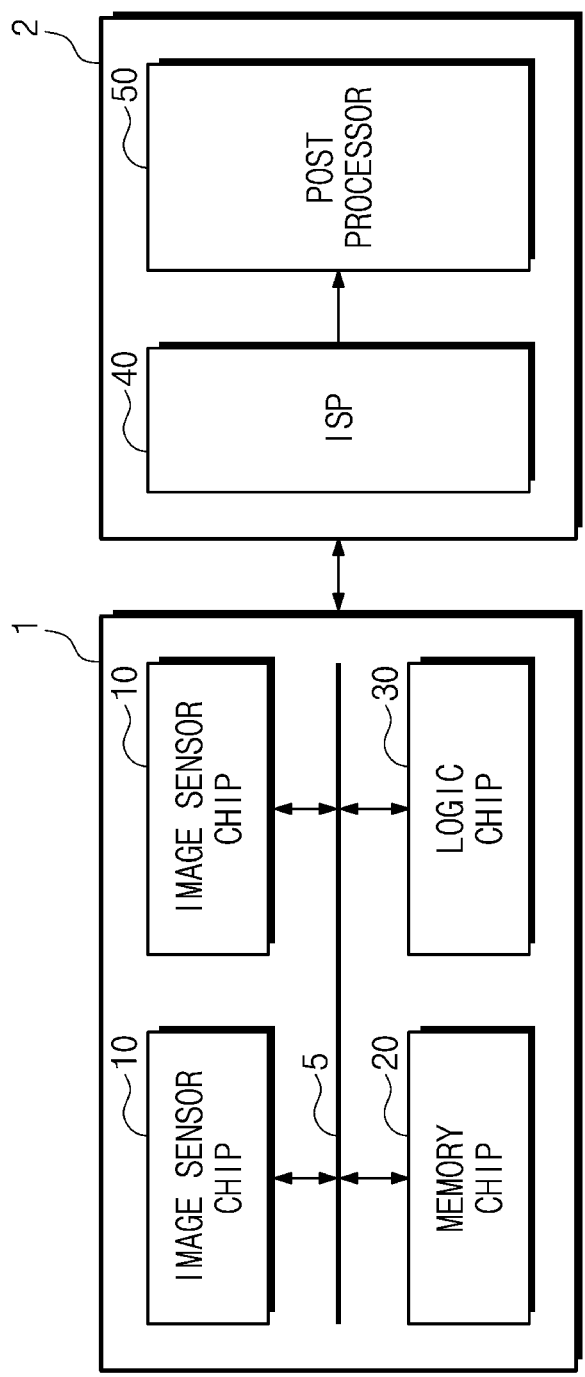
FIG. 1 is a block diagram illustrating a semiconductor package and an image processing device according to some embodiments of the inventive concepts.

FIG. 1 is a block diagram illustrating a semiconductor package and an image processing device according to some embodiments of the inventive concepts.

Referring to FIG. 1, a semiconductor package 1 may include image sensor chips 10, a memory chip 20, and a logic chip 30. Each of the image sensor chips 10 may include a pixel array including a plurality of unit pixels. Each of the image sensor chips 10 may receive light and may output pixel signals. The logic chip 30 may be configured to process the pixel signals outputted from the image sensor chips 10. The memory chip 20 may be configured to receive and store the pixel signals processed by the logic chip 30. The memory chip 20 may be configured to directly receive and store the pixel signals outputted from the image sensor chips 10.

The image sensor chips 10 may be electrically connected to the memory chip 20 and the logic chip 30 through a signal line 5. The signal line 5 may electrically connect the memory chip 20 and the logic chip 30 to each other. For example, the signal line 5 may include conductive patterns formed in a package substrate and/or an interposer substrate, and may include interconnection lines and/or through-electrodes/through-vias, and/or other connection members including solder balls/bumps. The memory chip 20 may be configured to receive the pixel signals, which are generated from the image sensor chip 10 and are processed by the logic chip 30, through the signal line 5. Alternatively, the memory chip 20 may be configured to directly receive the pixel signal from the image sensor chip 10. For example, the memory chip 20 may be a memory chip such as a DRAM chip, a SRAM chip, a MRAM chip, or a flash memory chip, and may be formed of a semiconductor die formed from a semiconductor wafer.

As used herein, components described as being "electrically connected" are configured such that an electrical signal can be transferred from one component to the other (although such electrical signal may be attenuated in strength as it is transferred and may be selectively transferred).

The logic chip 30 may include a plurality of analog-to-digital converters (ADCs). The pixel signals outputted from the pixel array of the image sensor chip 10 may be transmitted to the logic chip 30 and may be processed in the plurality of analog-to-digital converters (ADCs) included in the logic chip 30. The pixel signals processed by the logic chip 30 may be written in a memory cell array of the memory chip 20.

The pixel signals processed by the logic chip 30 may be transmitted to an image processing device 2. The image processing device 2 may include at least one image signal processor (ISP) 40 and a post processor 50. For example, the image processing device 2 may be formed of multiple processors and/or multiple semiconductor chips. The image processing device 2 may output images obtained by the image sensor chip 10 as previews through a display (not shown). When a capture command is inputted by a user or by a preset procedure, the images obtained by the image sensor chip 10 may be stored in the memory chip 20. The post processor 50 may perform various operations for providing digital image signals from the images obtained by the image sensor chip 10. For example, the post processor 50 may perform various post-processing algorithms for contrast improvement, resolution (or sharpness) improvement and noise removal, which are not performed by the image signal processor 40. For example, image information obtained by the image sensor chip 10 may be processed partially in the image signal processor 40 and partially in the post processor 50 to improve image qualities. For example, the image signal processor 40 may evaluate color and/or brightness data from each photodiode PD and/or from each image sensor chip 10. Output signals from the post processor 50 may be provided to a video codec processor (not shown), and an image through the video codec processor may be outputted to the display or may be stored in the memory chip 20.

Figure 2:
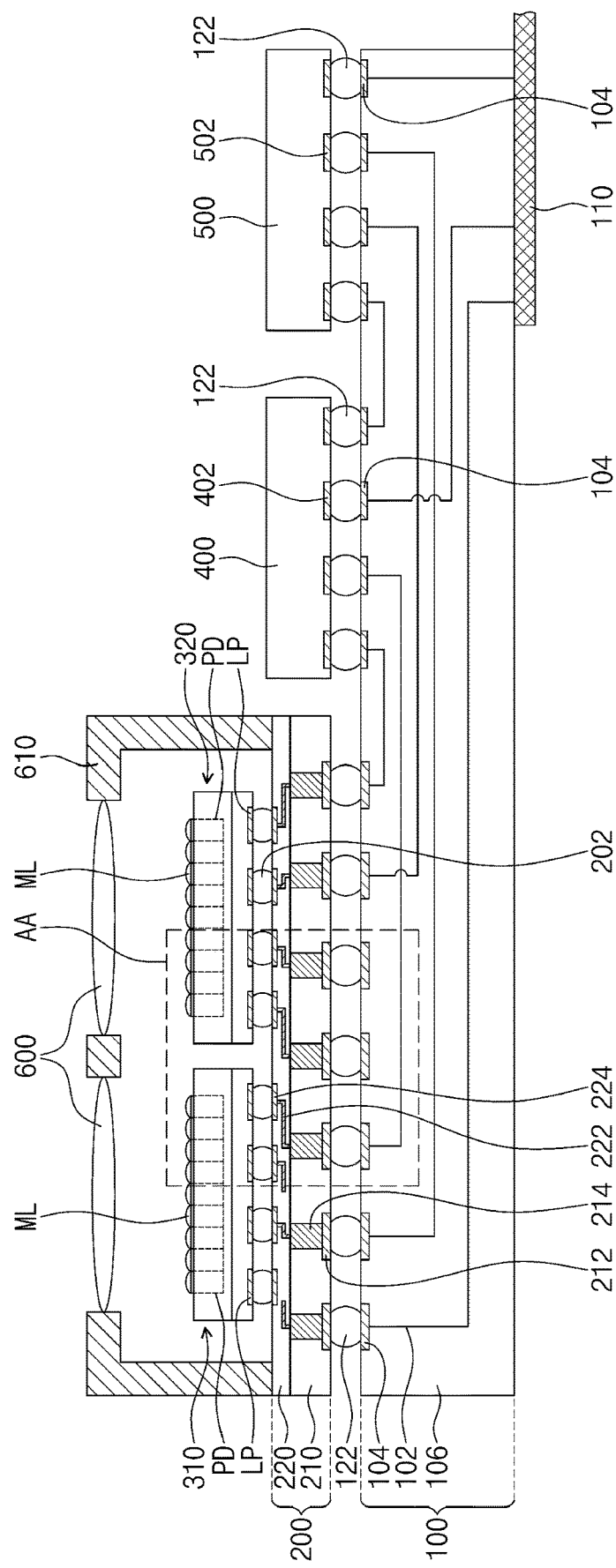
FIG. 2 is a cross-sectional view illustrating a semiconductor package according to some embodiments of the inventive concepts.
Figure 3:
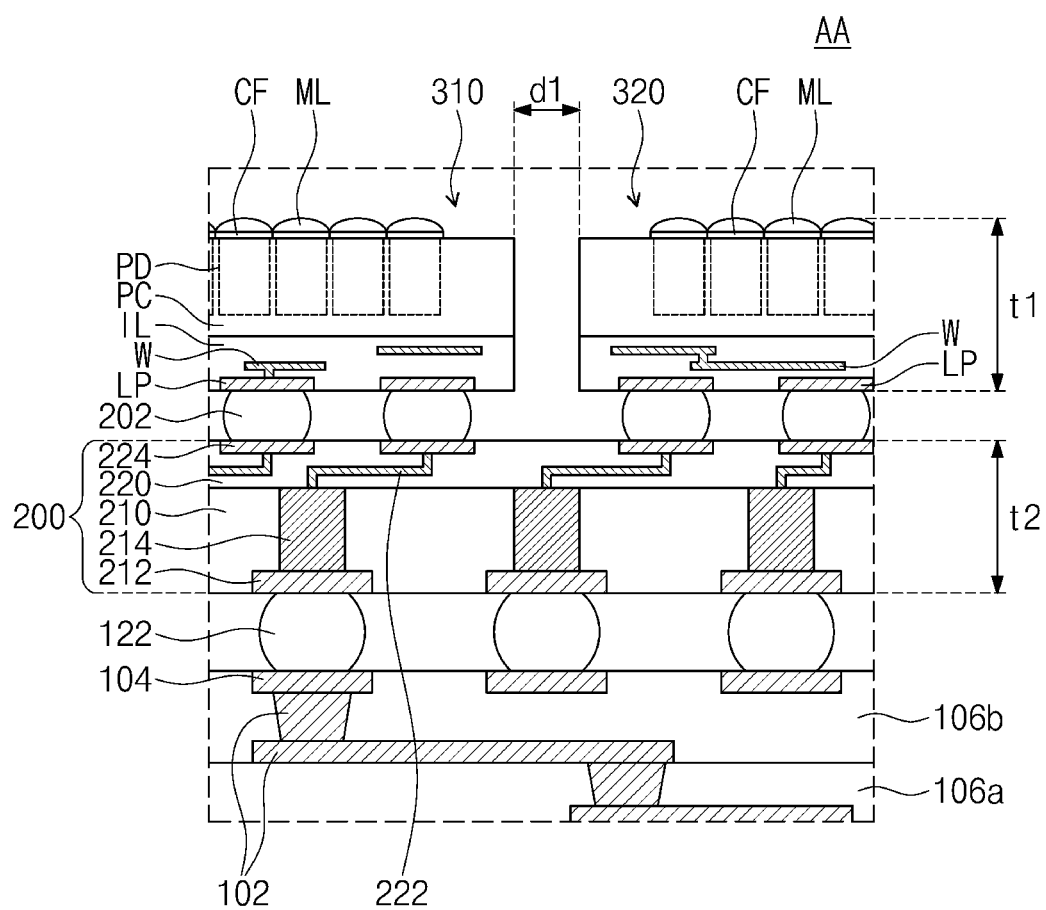
FIG. 3 is an enlarged cross-sectional view of a portion 'AA' of FIG. 2.

FIG. 2 is a cross-sectional view illustrating a semiconductor package according to some embodiments of the inventive concepts. FIG. 3 is an enlarged cross-sectional view of a portion 'AA' of FIG. 2.

Referring to FIG. 2, a package substrate 100 may be disposed in a lower portion of a semiconductor package. The package substrate 100 may include a printed circuit board (PCB) having an interconnection pattern therein. The package substrate 100 may include a plurality of insulator layers and circuit patterns. For example, the package substrate 100 may include a multi-layered printed circuit board.

The package substrate 100 may include a base layer 106, first interconnection lines 102, first pads 104, and an external connection terminal 110. The base layer 106 may include the plurality of insulator layers. The plurality of insulator layers may include at least one of a phenol resin, an epoxy resin, or polyimide. For example, The plurality of insulator layers may include at least one of flame retardant 4 (FR4), tetra-functional epoxy, polyphenylene ether, epoxy/polyphenylene oxide, bismaleimide triazine (BT), thermount, cyanate ester, polyimide, or liquid crystal polymer.

The first pads 104 may be disposed on a top surface of the base layer 106. The first pads 104 may include or be formed of, for example, copper (Cu). The first interconnection lines 102 may be located in the base layer 106. The first interconnection lines 102 may be the circuit patterns in the plurality of insulator layers. The first interconnection lines 102 may electrically connect at least some of the first pads 104 to each other and/or may electrically connect at least some of the first pads 104 to the external connection terminal 110. The external connection terminal 110 may be disposed on a bottom surface of the base layer 106.

In some embodiments, the external connection terminal 110 may include or be formed of, for example, a flexible film and an interconnection pattern formed in the flexible film. The semiconductor package 1 described with reference to FIG. 1 may have the same cross-sectional view as or a similar cross-sectional view to the one in FIG. 2 and may be electrically connected to the image processing device 2 through the external connection terminal 110.

In certain embodiments, terminal pads and solder balls (or solder bumps) may be disposed on a bottom surface of the package substrate 100. In this case, the semiconductor package may be provided in a ball grid array (BGA) type, a fine ball-grid array (FBGA) type or a land grid array (LGA) type.

Referring to FIGS. 2 and 3, a connection substrate 200 may be provided on a top surface of the package substrate 100. The connection substrate 200 may be disposed between the package substrate 100 and first and second image sensor chips 310 and 320. The connection substrate 200 may include a support layer 210, first connection pads 212, second connection pads 224, through-electrodes 214, and a redistribution layer. The redistribution layer may be provided on the support layer 210 and electrically connected to the through-electrode 214. The redistribution layer may include an insulating layer 220 and second interconnection lines 222.

The support layer 210 may have a bottom surface facing the package substrate 100 and a top surface opposite to the bottom surface. The first connection pads 212 may be disposed on the bottom surface of the support layer 210. The first connection pads 212 may face some of the first pads 104 of the package substrate 100. First connection terminals 122 may be disposed between the first connection pads 212 and the first pads 104 to electrically connect the package substrate 100 and the connection substrate 200 to each other. Each of the first connection terminals 122 may have a solder ball shape or a solder bump shape. For example, the first connection terminals may be solder balls or solder bumps.

The insulating layer 220 may be stacked on the top surface of the support layer 210. For example, the insulating layer 220 may include at least one of silicon oxide, silicon nitride, or silicon oxynitride. The insulating layer 220 may cover the top surface of the support layer 210 and one surface (e.g., a top surface) of each of the through-electrodes 214. The second connection pads 224 may be disposed on a top surface of the insulating layer 220. In some embodiments, a distance between two second connection pads 224 adjacent to each other may be less than a distance between two first connection pads 212 adjacent to each other. The second connection pads 224 may include or be formed of, for example, copper.

The second interconnection lines 222 electrically connecting the second connection pads 224 to the through-electrodes 214 may be disposed in the insulating layer 220. The second interconnection lines 222 may connect/contact bottom surfaces of the second connection pads 224 to top surfaces of the through-electrodes 214. The second interconnection lines 222 may have widths less than those of the through-electrodes 214. The second interconnection lines 222 and the insulating layer 220 may function as a redistribution layer. The second connection pads 224 may be arranged at a different pitch from the through-electrodes 214 and the first pads 104. Some of the second connection pads 224 may be offset from through-electrodes 214 and the first pads 104.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The through-electrodes 214 may penetrate the support layer 210 to electrically connect the second interconnection lines 222 to the first connection pads 212. The support layer 210 may include a different element from an element included in the base layer 106 of the package substrate 100. The support layer 210 may include or be formed of silicon. For example, the support layer 210 may be a portion of a silicon wafer remaining after a thinning process. For example, forming the support layer 210 with a silicon wafer using a thinning process may be beneficial to reduce distances between image sensor chips 310 and 320. Processes forming insulating patterns and conductor patterns in and on the silicon wafers and thinning silicon wafers are well established. Each of the through-electrodes 214 may be a through-silicon via (TSV) vertically penetrating a silicon layer. The through-electrodes 214 may include or be formed of a conductive material. The through-electrodes 214 may include or be formed of, for example, copper or tungsten. In some embodiments, a barrier layer for electrically insulating the through-electrodes 214 from the support layer 210 may be provided between the support layer 210 and the through-electrodes 214.

A plurality of image sensor chips 310 and 320 may be disposed on the connection substrate 200. The plurality of image sensor chips 310 and 320 may be mounted on the redistribution layer of the connection substrate 200. The plurality of image sensor chips 310 and 320 may include a first image sensor chip 310 and a second image sensor chip 320, which are horizontally spaced apart from each other on a top surface of the connection substrate 200. Each of the first and second image sensor chips 310 and 320 may include lower chip pads LP on its bottom surface. The lower chip pads LP may face the second connection pads 224 of the connection substrate 200. Second connection terminals 202 may be disposed between the lower chip pads LP and the second connection pads 224 to electrically connect the lower chip pads LP to the second connection pads 224. Each of the second connection terminals 202 may have a solder ball shape or a solder bump shape. For example, the second connection terminals 202 may be solder balls or solder bumps. Here, a diameter of the second connection terminal 202 may be less than a diameter of the first connection terminal 122.

In some embodiments, the first image sensor chip 310 may include an interlayer insulating layer IL, a photoelectric conversion layer PC on the interlayer insulating layer IL, a color filter layer CF on the photoelectric conversion layer PC, and micro lenses ML on the color filter layer CF. A plurality of photodiodes PD may be formed in the photoelectric conversion layer PC. The photodiodes PD may be two-dimensionally arranged when viewed in a plan view. The photodiodes PD may receive light incident through the micro lenses ML and the color filter layer CF and may generate electrical signals. In some embodiments, partitions for preventing optical interference between the photodiodes PD may be located between the photodiodes PD. The partitions may be, for example, deep trench isolation (DTI) portions. Transistors may be formed adjacent to a bottom surface of the photoelectric conversion layer PC. The transistors may switch the electrical signals generated by the photodiodes PD.

The interlayer insulating layer IL may be disposed on the bottom surface of the photoelectric conversion layer PC. Internal interconnection lines W may be provided in the interlayer insulating layer IL and may provide the electrical signals generated from the photodiodes PD to the second connection pads 224.

The second image sensor chip 320 may include an interlayer insulating layer IL, a photoelectric conversion layer PC on the interlayer insulating layer IL, a color filter layer CF on the photoelectric conversion layer PC, and micro lenses ML on the color filter layer CF. In some embodiments, the second image sensor chip 320 may have the same structure as or a similar structure to the first image sensor chip 310.

The first image sensor chip 310 and the second image sensor chip 320 may have the same width in a horizontal direction and the same thickness t1 in a vertical direction. The first image sensor chip 310 and the second image sensor chip 320 may be spaced apart from each other in a horizontal direction parallel to the top surface of the connection substrate 200. The first image sensor chip 310 and the second image sensor chip 320 may have sidewalls facing each other. A distance d1 between the first image sensor chip 310 and the second image sensor chip 320 may be less than the thickness t1 of the first image sensor chip 310 and the second image sensor chip 320. The distance d1 may be measured in a horizontal direction perpendicular to the facing sidewalls of the first and second image sensor chips 310 and 320.

For example, the thickness t1 of the first image sensor chip 310 and the second image sensor chip 320 may range from 130 μm to 170 μm. For example, the thickness t1 of the first image sensor chip 310 and the second image sensor chip 320 may be in a range between 130 μm and 170 μm. The distance d1 between the first image sensor chip 310 and the second image sensor chip 320 may range from 30 μm to 50 μm. For example, the distance d1 between the first image sensor chip 310 and the second image sensor chip 320 may be in a range between 30 μm and 50 μm.

The distance d1 between the first image sensor chip 310 and the second image sensor chip 320 may be adjusted by a pitch of the lower chip pads LP. The pitch of the lower chip pads LP may be less than a pitch of the first pads 104, and thus the distance d1 between the first image sensor chip 310 and the second image sensor chip 320 may be less than a distance between a first semiconductor chip 400 and a second semiconductor chip 500, which will be described later. As a result, when mounting the plurality of image sensor chips 310 and 320 on the package substrate 100, an area occupied by the image sensor chips 310 and 320 may be reduced.

In some embodiments, the distance d1 between the first image sensor chip 310 and the second image sensor chip 320 may be less than a vertical thickness t2 of the connection substrate 200. For example, the thickness t2 of the connection substrate 200 may range from 80 µm to 120 µm. For example, the thickness t2 of the connection substrate 200 may be in a range between 80 µm and 120 µm. In addition, the thickness t2 of the connection substrate 200 may be less than the thickness t1 of the first image sensor chip 310 and the second image sensor chip 320.

Referring again to FIG. 2, a first semiconductor chip 400 and a second semiconductor chip 500 may be mounted on the package substrate 100. The first semiconductor chip 400 and the second semiconductor chip 500 may be horizontally spaced apart from each other on the top surface of the package substrate 100. The first semiconductor chip 400 may include or may be one of a memory chip and a logic chip, and the second semiconductor chip 500 may include or may be the other of the memory chip and the logic chip.

The first semiconductor chip 400 may include first chip pads 402 on its bottom surface. The first chip pads 402 may face first pads 104 of the package substrate 100. First connection terminals 122 may be disposed between the first chip pads 402 and the first pads 104 to electrically connect the first semiconductor chip 400 to the package substrate 100. Each of the first connection terminals 122 may have a solder ball shape or a solder bump shape. For example, the first connection terminals 122 may be solder balls or solder bumps.

The second semiconductor chip 500 may include second chip pads 502 on its bottom surface. The second chip pads 502 may face first pads 104 of the package substrate 100. First connection terminals 122 may be disposed between the second chip pads 502 and the first pads 104 to electrically connect the second semiconductor chip 500 to the package substrate 100.

A lens holder 610 may be disposed on the top surface of the connection substrate 200. The lens holder 610 may support lenses 600. Each of the lenses 600 may vertically overlap with each of the plurality of image sensor chips 310 and 320.

The lenses 600 may be vertically spaced apart from the plurality of image sensor chips 310 and 320 and may face the plurality of image sensor chips 310 and 320. Each of the lenses 600 may condense light and may provide the condensed light to each of the plurality of image sensor chips 310 and 320.

Figure 4:
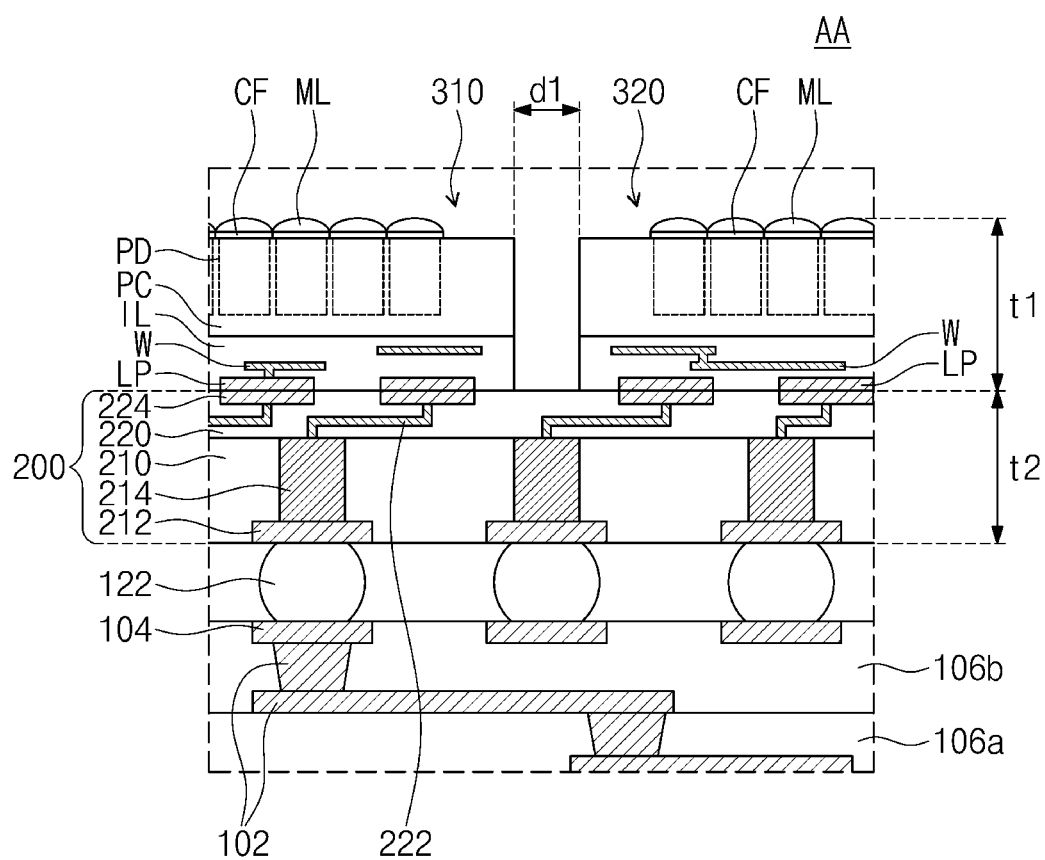
FIG. 4 is an enlarged cross-sectional view corresponding to the portion 'AA' of FIG. 2 to illustrate a semiconductor package according to some embodiments of the inventive concepts.

FIG. 4 is an enlarged cross-sectional view corresponding to the portion 'AA' of FIG. 2 to illustrate a semiconductor package according to some embodiments of the inventive concepts. The descriptions to the same components as or similar components to the ones in the above embodiments may be omitted for the purpose of ease and convenience in explanation.

Referring to FIG. 4, the connection substrate 200 and the first image sensor chip 310 may be electrically connected to each other without the second connection terminals 202 described above. The lower chip pads LP of the first image sensor chip 310 may be in contact with some of the second connection pads 224 of the connection substrate 200. The connection substrate 200 and the second image sensor chip 320 may also be electrically connected to each other without the second connection terminals 202. The lower chip pads LP of the second image sensor chip 320 may be in contact with other second connection pads 224 of the connection substrate 200.

Figure 5:
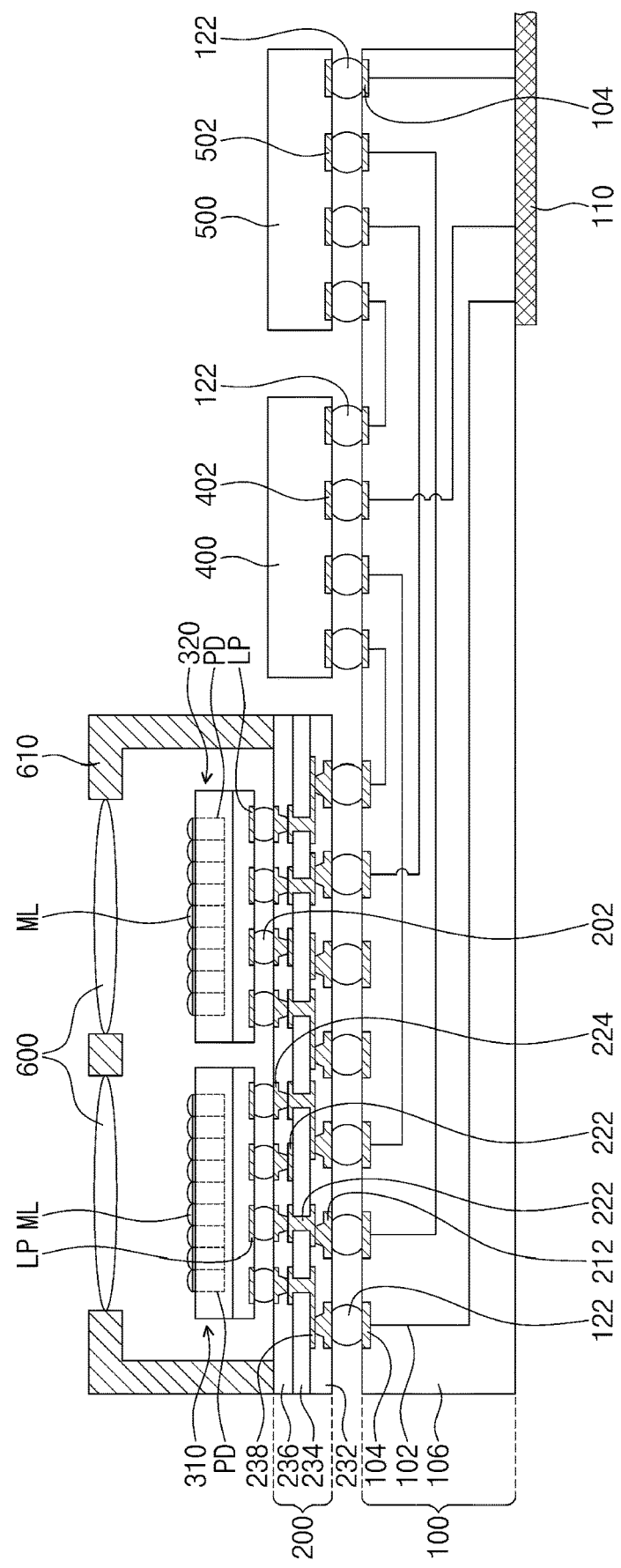
FIGS. 5 to 7 are cross-sectional views illustrating semiconductor packages according to some embodiments of the inventive concepts.
Figure 6:
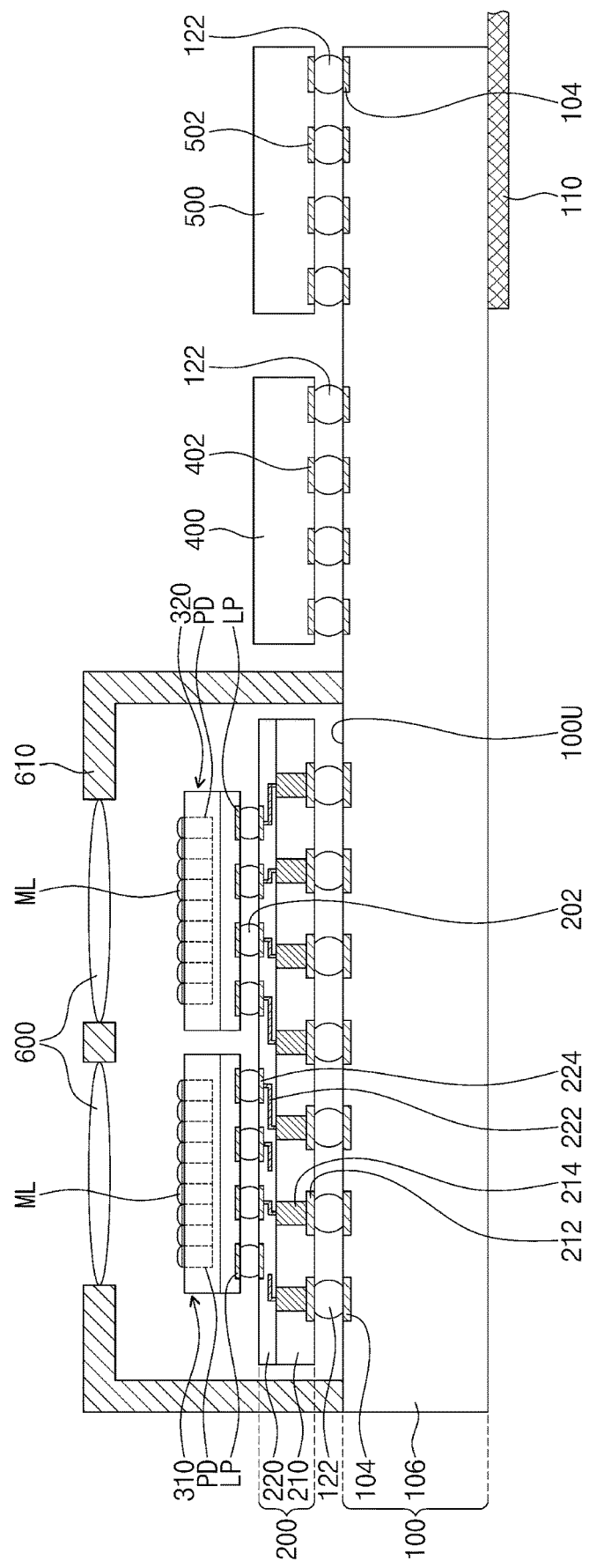
Figure 7:
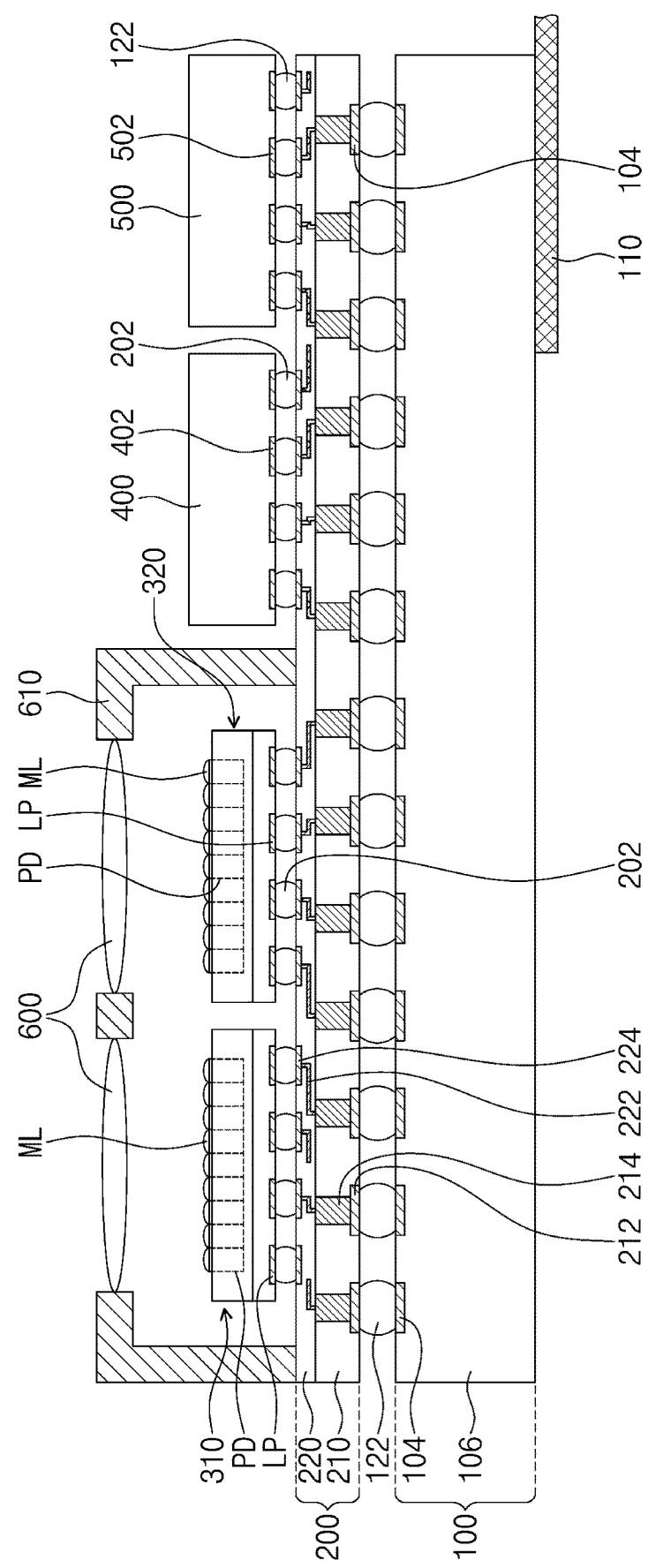

FIGS. 5 to 7 are cross-sectional views illustrating semiconductor packages according to some embodiments of the inventive concepts. The descriptions to the same components as or similar components to the ones in the above embodiments may be omitted for the purpose of ease and convenience in explanation.

Referring to FIG. 5, a connection substrate 200 may include a plurality of upper base layers 232, 234 and 236, first connection pads 212, second connection pads 224, and second interconnection lines 222. The plurality of upper base layers 232, 234 and 236 may include or be formed of a first upper base layer 232, a second upper base layer 234, and a third upper base layer 236. The plurality of upper base layers 232, 234 and 236 may include at least one of a phenol resin, an epoxy resin, or polyimide. For example, the plurality of upper base layers 232, 234 and 236 may include at least one of flame retardant 4 (FR4), tetrafunctional epoxy, polyphenylene ether, epoxy/polyphenylene oxide, bismaleimide triazine (BT), thermount, cyanate ester, polyimide, or liquid crystal polymer.

The first connection pads 212 may be exposed at a bottom surface of the first upper base layer 232. The first connection pads 212 may partially penetrate the first upper base layer 232 so as to be electrically connected to the second interconnection lines 222. For example, top surfaces of the first connection pads 212 may be a higher vertical level than a bottom surface of the first upper base layer 232. In certain embodiments, bottom surfaces of the first connection pads 212 may be at the same vertical level as the bottom surface of the first upper base layer 232.

The second connection pads 224 may be exposed at a top surface of the third upper base layer 236. The second connection pads 224 may partially penetrate the third upper base layer 236 so as to be electrically connected to the second interconnection lines 222. For example, bottom surfaces of the second connection pads 224 may be positioned at a lower vertical level than a top surface of the third upper base layer 236. In certain embodiments, top surfaces of the second connection pads 224 may be at the same vertical level as the top surface of the third upper base layer 236.

The second interconnection lines 222 may vertically penetrate the second upper base layer 234 to electrically connect the first connection pads 212 to the second connection pads 224.

Referring to FIG. 6, a lens holder 610 may be disposed on the base layer 106 of the package substrate 100, unlike FIG. 2. One sidewall of the lens holder 610 may be located between the connection substrate 200 and the first semiconductor chip 400. Another sidewall of the lens holder 610 may be located adjacent to a side surface of the package substrate 100. For example, the other sidewall of the lens holder 610 may be vertically aligned with the side surface of the package substrate 100. For example, an outer surface of the sidewall of the lens holder 610 and the side surface of the package substrate 100 may be at the same plane extending in a vertical direction.

Referring to FIG. 7, a connection substrate 200 may be formed on an entire top surface of the package substrate 100. For example, the connection substrate 200 may fully overlap the package substrate 100 in a vertical direction. The first semiconductor chip 400 and the second semiconductor chip 500 may be mounted on a top surface of the connection substrate 200 and may be horizontally spaced apart from each other.

For example, the first semiconductor chip 400 may include first chip pads 402 on its bottom surface. The first chip pads 402 may face some of the second connection pads 224 of the connection substrate 200. Second connection terminals 202 may be disposed between the first chip pads 402 and the second connection pads 224 to electrically connect the first semiconductor chip 400 to the connection substrate 200.

The second semiconductor chip 500 may include second chip pads 502 on its bottom surface. The second chip pads 502 may face other second connection pads 224 of the connection substrate 200. Second connection terminals 202 may be disposed between the second chip pads 502 and the second connection pads 224 to electrically connect the second semiconductor chip 500 to the connection substrate 200.

Figure 8:
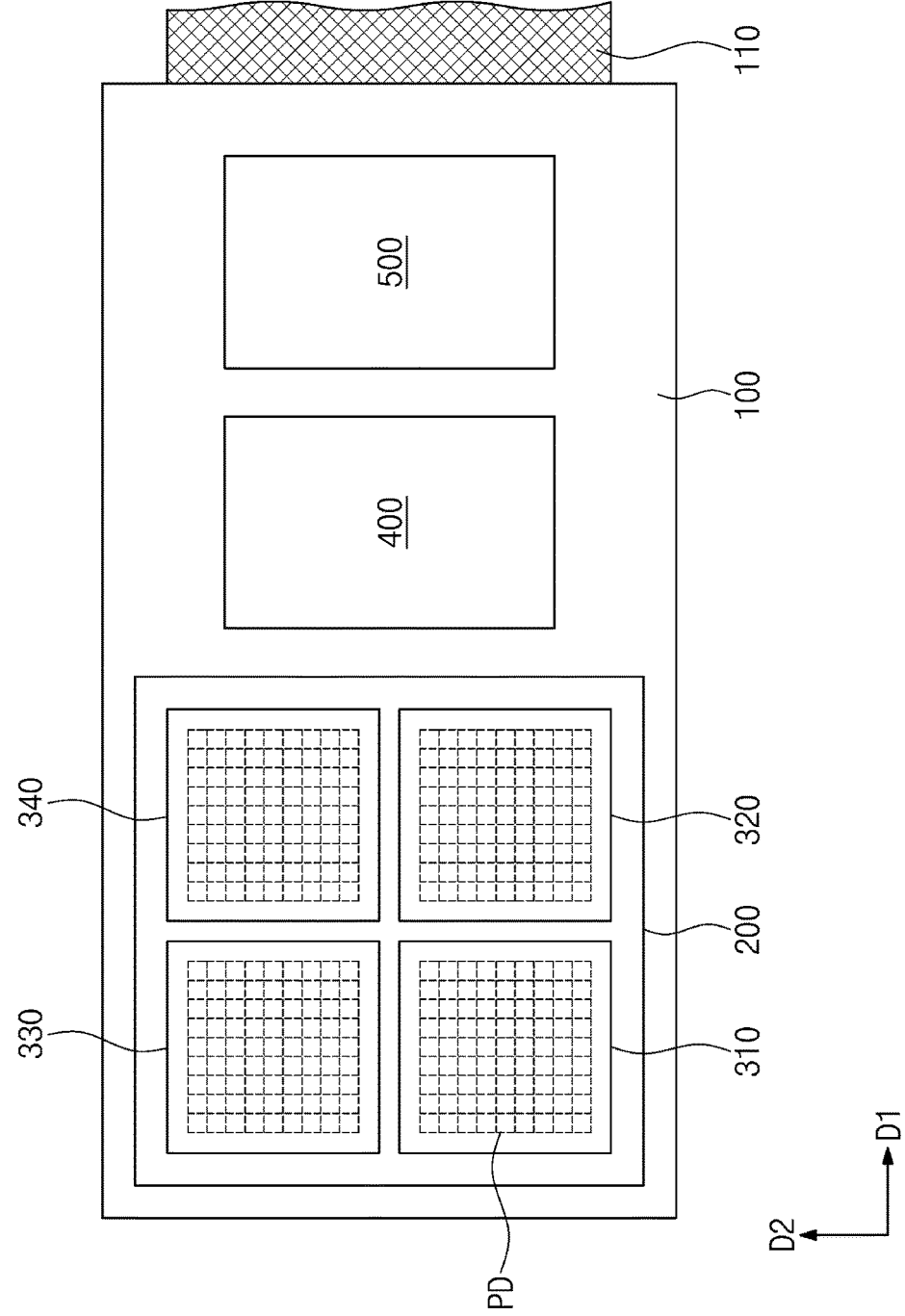
FIG. 8 is a plan view illustrating a semiconductor package according to some embodiments of the inventive concepts.

FIG. 8 is a plan view illustrating a semiconductor package according to some embodiments of the inventive concepts. The descriptions to the same components as or similar components to the ones in the above embodiments may be omitted for the purpose of ease and convenience in explanation.

Referring to FIG. 8, a semiconductor package according to some embodiments of the inventive concepts may include first to fourth image sensor chips 310, 320, 330 and 340 mounted on the connection substrate 200. The first to fourth image sensor chips 310, 320, 330 and 340 may be arranged in a first direction D1 and a second direction D2, e.g., in a matrix form. The first direction D1 may be parallel to the top surface of the connection substrate 200. The second direction D2 may be parallel to the top surface of the connection substrate 200 and may be perpendicular to the first direction D1.

Figure 9:
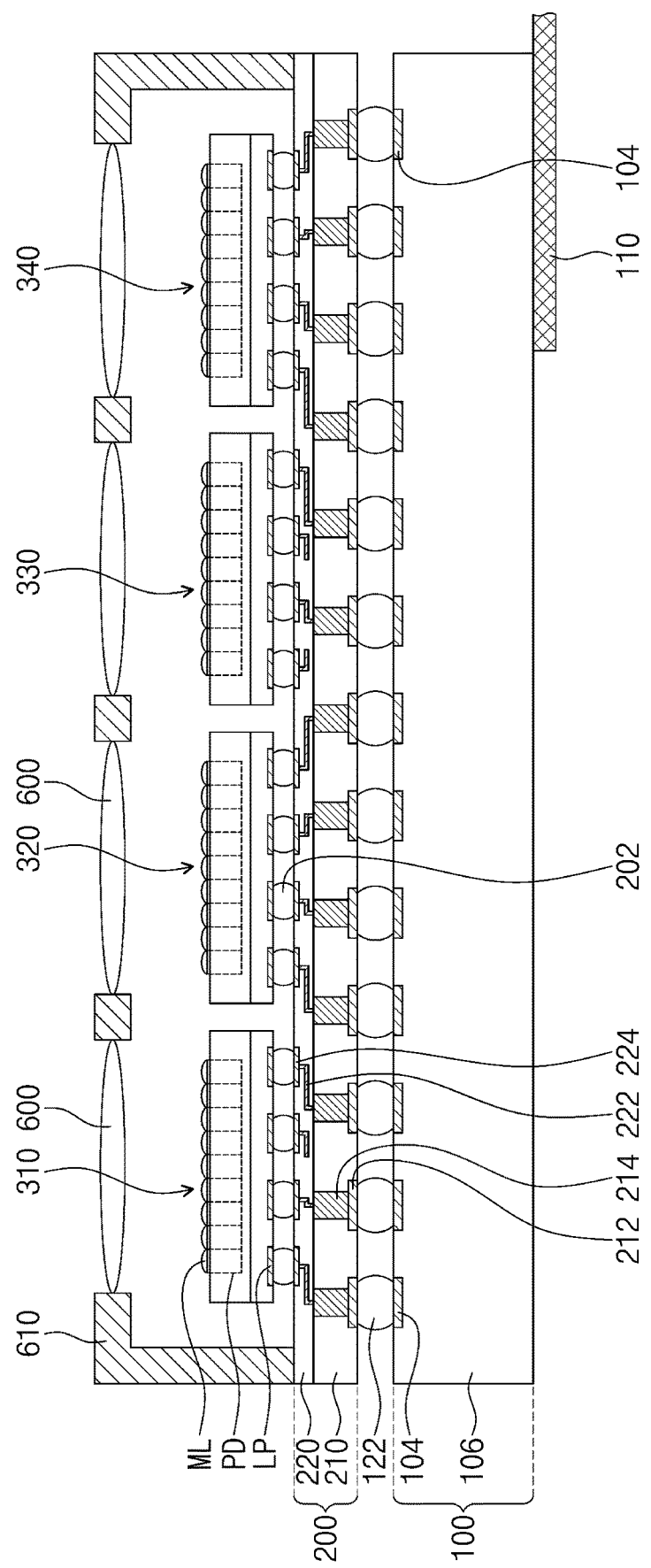
FIG. 9 is a cross-sectional view illustrating a semiconductor package according to some embodiments of the inventive concepts.

FIG. 9 is a cross-sectional view illustrating a semiconductor package according to some embodiments of the inventive concepts. The descriptions to the same components as or similar components to the ones in the above embodiments may be omitted for the purpose of ease and convenience in explanation.

Referring to FIG. 9, a semiconductor package according to some embodiments of the inventive concepts may include first to fourth image sensor chips 310, 320, 330 and 340 mounted on the connection substrate 200. The first to fourth image sensor chips 310, 320, 330 and 340 may be arranged in one direction, unlike FIG. 8.

Lenses 600, which vertically face the first to fourth image sensor chips 310, 320, 330 and 340, respectively, may be supported by a lens holder 610.

Figure 10:
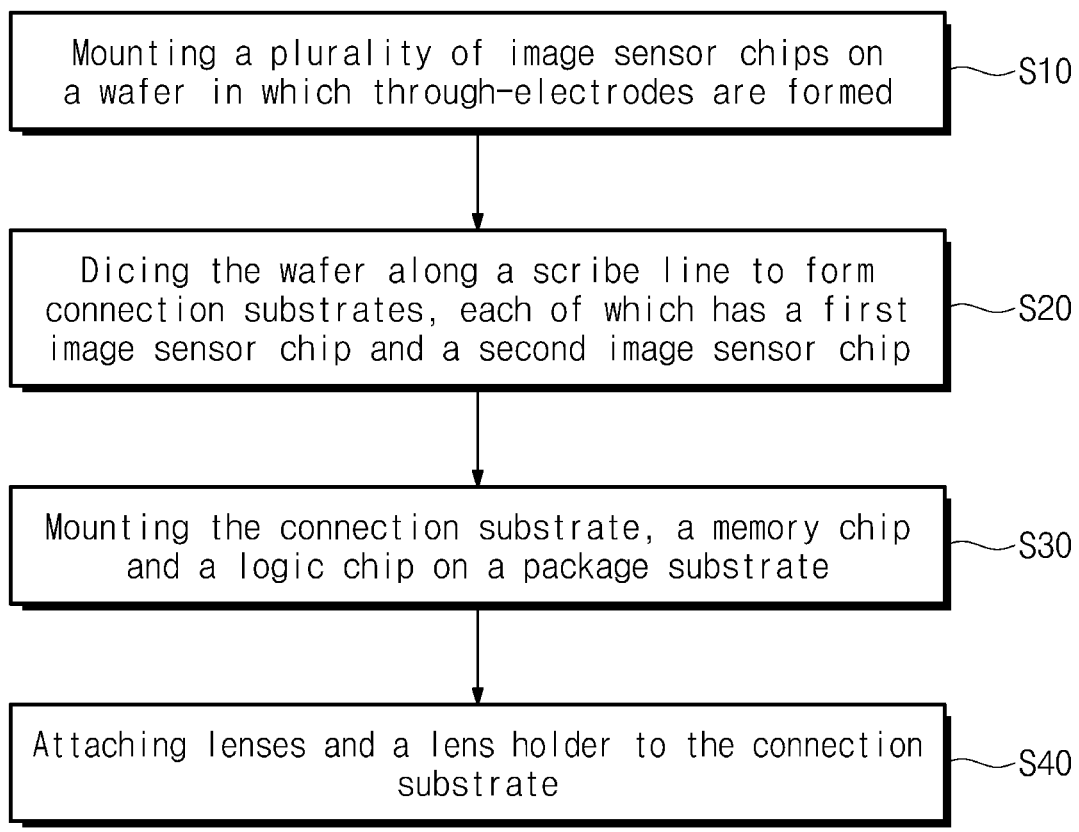
FIG. 10 is a flowchart illustrating a method of manufacturing a semiconductor package, according to some embodiments of the inventive concepts.
Figure 11:
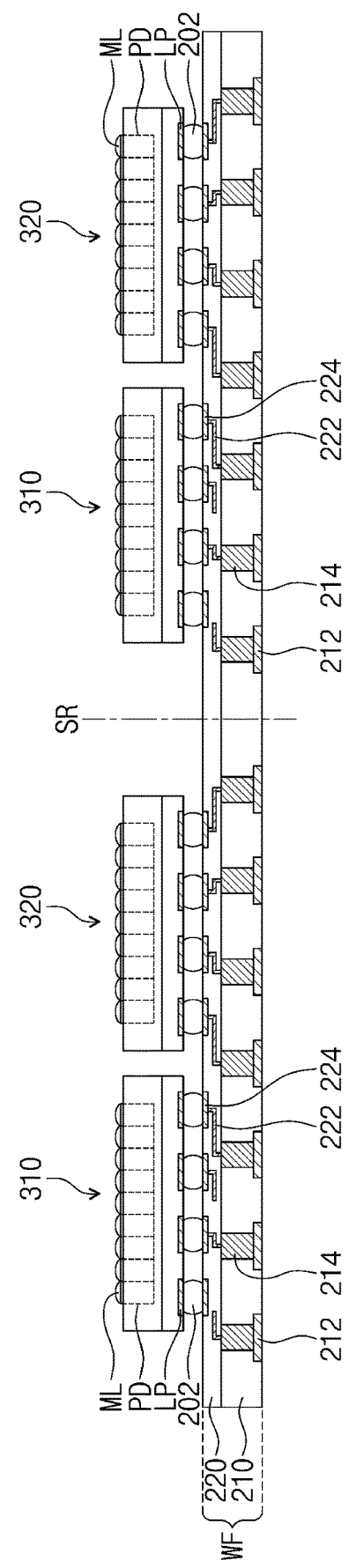
FIGS. 11 and 12 are cross-sectional views illustrating a method of manufacturing a semiconductor package, according to some embodiments of the inventive concepts.
Figure 12:
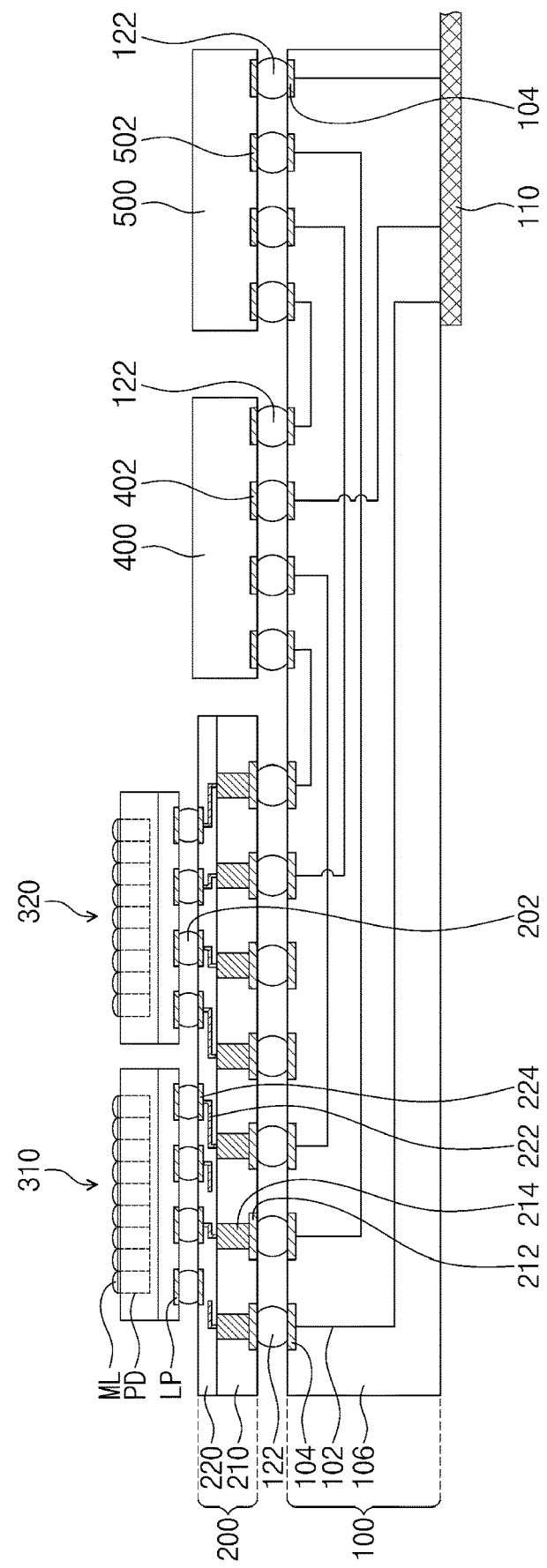

FIG. 10 is a flowchart illustrating a method of manufacturing a semiconductor package, according to some embodiments of the inventive concepts. FIGS. 11 and 12 are cross-sectional views illustrating a method of manufacturing a semiconductor package, according to some embodiments of the inventive concepts.

Referring to FIGS. 10 and 11, a plurality of image sensor chips 310 and 320 may be mounted on a wafer WF in which through-electrodes 214 are formed (S10). The wafer WF may include a support layer 210, an insulating layer 220, first connection pads 212, second connection pads 224, the through-electrodes 214, and second interconnection lines 222.

Next, the wafer WF may be diced along a scribe line SR to form connection substrates 200, each of which has a first image sensor chip 310 and a second image sensor chip 320 (S20).

Referring to FIGS. 10 and 12, the connection substrate 200, a first semiconductor chip 400 and a second semiconductor chip 500 may be mounted on a package substrate 100 (S30).

Referring to FIGS. 10 and 2, lenses 600 and a lens holder 610 may be attached to the connection substrate 200 (S40).

According to the embodiments of the inventive concepts, semiconductor packages may be provided with reduced mounting areas of image sensor chips and with improved electrical efficiency and reliability.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
   a package substrate;
   a connection substrate on the package substrate;
   a first image sensor chip on the connection substrate;
   a second image sensor chip on the connection substrate, the second image sensor chip being horizontally spaced apart from the first image sensor chip;
   a plurality of lenses including first and second lenses vertically overlapping the first and second image sensor chips respectively;
   a lens holder supporting the plurality of lenses; and
   a memory chip disposed on the package substrate and electrically connected to the first image sensor chip through the connection substrate,
   wherein the lens holder comprises sidewalls extending vertically from a top surface of the connection substrate and an upper portion extending horizontally from the sidewalls and holding the plurality of lenses such that the lens holder and the plurality of lenses together with the connection substrate enclose the first and second image sensor chips,
   wherein the upper portion of the lens holder is disposed at the same height as the plurality of lenses,
   wherein a portion of the lens holder is interposed between the plurality of lenses,
   wherein the portion of the lens holder contacts the plurality of lenses, and
   wherein a distance between the first image sensor chip and the second image sensor chip is less than a vertical thickness of the first image sensor chip.

2. The semiconductor package of claim 1, wherein the distance between the first image sensor chip and the second image sensor chip is less than a vertical thickness of the connection substrate.

3. The semiconductor package of claim 1, wherein the distance between the first image sensor chip and the second image sensor chip is in a range between 30 µm and 50 µm.

4. The semiconductor package of claim 1, wherein a vertical thickness of the connection substrate is less than the vertical thickness of the first image sensor chip.

5. The semiconductor package of claim 1, wherein a vertical thickness of the connection substrate is in a range between 80 μm and 120 μm.

6. The semiconductor package of claim 1, wherein the connection substrate has first pads on a first surface facing the package substrate and has second pads on a second surface facing the first image sensor chip, and
wherein a pitch of the second pads is less than a pitch of the first pads.

7. The semiconductor package of claim 1, wherein the connection substrate comprises: a support layer; a through-electrode vertically penetrating the support layer; and a redistribution layer disposed on the support layer and the through-electrode.

8. The semiconductor package of claim 7, wherein the support layer includes silicon.

9. The semiconductor package of claim 1, further comprising:
a logic chip mounted on the package substrate and electrically connected to the first image sensor chip through the connection substrate,
wherein the distance between the first image sensor chip and the second image sensor chip is less than a distance between the memory chip and the logic chip.

10. A semiconductor package comprising:
a package substrate;
a connection substrate disposed on the package substrate, the connection substrate comprising: a support layer; a through-electrode vertically penetrating the support layer; and a redistribution layer electrically connected to the through-electrode;
a first image sensor chip mounted on the redistribution layer;
a second image sensor chip mounted on the redistribution layer and horizontally spaced apart from the first image sensor chip;
a first semiconductor chip disposed on the package substrate and electrically connected to the first image sensor chip through the connection substrate;
a second semiconductor chip disposed on the package substrate and electrically connected to the first image sensor chip through the connection substrate; and
a lens holder supporting first and second lenses vertically overlapping the first and second image sensor chips respectively,
wherein the lens holder comprises sidewalls extending vertically from a top surface of the connection substrate and an upper portion extending horizontally from the sidewalls and holding the first and second lenses such that the lens holder and the first and second lenses together with the connection substrate enclose the first and second image sensor chips,
wherein the upper portion of the lens holder is disposed at the same height as the first and second lenses,
wherein a portion of the lens holder is interposed between the first and second lenses,
wherein the portion of the lens holder contacts the first and second lenses, and
wherein a distance between the first image sensor chip and the second image sensor chip is less than a distance between the first semiconductor chip and the second semiconductor chip.

11. The semiconductor package of claim 10, wherein the first semiconductor chip includes a logic chip, and
wherein the second semiconductor chip includes a memory chip.

12. The semiconductor package of claim 10, wherein the distance between the first image sensor chip and the second image sensor chip is less than a vertical thickness of the connection substrate.

13. The semiconductor package of claim 10, wherein the distance between the first image sensor chip and the second image sensor chip is in a range between 30 μm and 50 μm.

14. The semiconductor package of claim 10, wherein a vertical thickness of the connection substrate is less than a vertical thickness of the first image sensor chip.

15. A semiconductor package comprising:
a package substrate;
a connection substrate on the package substrate;
a first image sensor chip on the connection substrate;
a second image sensor chip horizontally spaced apart from the first image sensor chip on the connection substrate;
a plurality of lenses including first and second lenses vertically overlapping the first and second image sensor chips respectively;
a lens holder supporting the plurality of lenses;
a memory chip disposed on the package substrate and electrically connected to the first image sensor chip through the connection substrate; and
a logic chip disposed on the package substrate and horizontally spaced apart from the memory chip,
wherein the lens holder comprises sidewalls extending vertically from a top surface of the package substrate and an upper portion extending horizontally from the sidewalls and holding the plurality of lenses such that the lens holder and the plurality of lenses together with the package substrate enclose the first and second image sensor chips,
wherein the upper portion of the lens holder is disposed at the same height as the plurality of lenses,
wherein a portion of the lens holder is interposed between the plurality of lenses,
wherein the portion of the lens holder contacts the plurality of lenses, and
wherein a distance between the first image sensor chip and the second image sensor chip is less than a distance between the memory chip and the logic chip.

16. The semiconductor package of claim 15, wherein the distance between the first image sensor chip and the second image sensor chip is less than a vertical thickness of the connection substrate.

17. The semiconductor package of claim 15, wherein the distance between the first image sensor chip and the second image sensor chip is less than a vertical thickness of the first image sensor chip and a vertical thickness of the second image sensor chip.

18. The semiconductor package of claim 15, wherein a vertical thickness of the connection substrate is less than a vertical thickness of the first image sensor chip.

19. The semiconductor package of claim 15, wherein the connection substrate has first pads on a first surface facing the package substrate and has second pads on a second surface facing the first image sensor chip, and
wherein a pitch of the second pads is less than a pitch of the first pads.

20. The semiconductor package of claim 15, wherein the connection substrate comprises: a support layer; a through-electrode vertically penetrating the support layer; and a redistribution layer disposed on the support layer and the through-electrode.

* * * * *